(12) United States Patent
Ishii

(10) Patent No.: US 7,633,297 B2
(45) Date of Patent: Dec. 15, 2009

(54) APPARATUS AND METHOD FOR DETECTING INTERNAL IMPEDANCE OF A BATTERY AND A DEGREE OF BATTERY DEGRADATION BASED ON DETECTED INTERNAL IMPEDANCE

(75) Inventor: Mitsunori Ishii, Sagamihara (JP)

(73) Assignees: NEC Corporation, Tokyo (JP); Fuji Jukogyo Kabushiki Kaisha, Tokyo (JP)

( * ) Notice: Subject to any disclaimer, the term of this patent is extended or adjusted under 35 U.S.C. 154(b) by 327 days.

(21) Appl. No.: 11/661,096

(22) PCT Filed: Jun. 23, 2005

(86) PCT No.: PCT/JP2005/011505

§ 371 (c)(1),
(2), (4) Date: Feb. 26, 2007

(87) PCT Pub. No.: WO2006/022073

PCT Pub. Date: Mar. 2, 2006

(65) Prior Publication Data

US 2008/0169819 A1    Jul. 17, 2008

(30) Foreign Application Priority Data

Aug. 25, 2004   (JP) ............................. 2004-245206

(51) Int. Cl.
    *G01N 27/416*   (2006.01)
(52) U.S. Cl. ..................................... 324/430

(58) Field of Classification Search ................. 324/426, 324/430, 433; 320/107, 130, 132, 150
See application file for complete search history.

(56) References Cited

U.S. PATENT DOCUMENTS 6,167,349 A    12/2000   Alvarez
7,103,460 B1 *  9/2006   Breed .......................... 701/29

FOREIGN PATENT DOCUMENTS

| JP | 10-214643 A   | 8/1998  |
| JP | 2000-121710 A | 4/2000  |
| JP | 2000-338201 A | 12/2000 |
| JP | 2001-013229 A | 1/2001  |
| KR | 10-0497572 B1 | 7/2005  |

* cited by examiner

Primary Examiner—Edward Tso
(74) Attorney, Agent, or Firm—Sughrue Mion, PLLC

(57) ABSTRACT

An internal impedance detecting apparatus for detecting the internal impedance of a secondary battery with high accuracy is provided. Processor 106 divides the variation of each voltage detected by voltage change detector 103 by the variation of the current detected by current change detector 105 for the same detecting time as that for the voltage variations to compute the internal impedances. Judging unit 107 checks the variations of the internal impedances computed by processor 106 and judges from the check result whether or not the internal impedances have reliability. Only when judging unit 107 judges that the internal impedances have reliability, generator 109 generates output internal impedance according to the internal impedances.

18 Claims, 4 Drawing Sheets

APPARATUS AND METHOD FOR DETECTING INTERNAL IMPEDANCE OF A BATTERY AND A DEGREE OF BATTERY DEGRADATION BASED ON DETECTED INTERNAL IMPEDANCE

This application claims priority from PCT Application No. PCT/JP2005/011505 filed Jun. 23, 2005, and from Japanese Patent Application No. 2004-245206 filed Aug. 25, 2004, which applications are incorporated herein by reference.

TECHNICAL FIELD

The present invention relates to an internal impedance detecting apparatus and an internal impedance detecting method for a secondary battery, and a degradation degree detecting apparatus and a degradation degree detecting method for a secondary battery.

BACKGROUND ART

At present, many hybrid automobiles, electric automobiles, or fuel battery automobiles incorporate a secondary battery as an electric power supply for supplying electric power required to start the engine and drive the vehicle.

The secondary battery keeps degraded depending on the ambient environment and the way in which it is used. Generally, when the secondary battery is degraded, the internal impedance thereof increases, and the capacity thereof decreases.

When the internal impedance increases, the supply of electric power from the secondary battery is restrained. Therefore, a vehicle which uses a secondary battery as an electric power supply suffers a performance change. It is therefore necessary to detect a degraded state of the secondary battery and optimally control the vehicle based on the detected degraded state. If the secondary battery is degraded to the point where the degradation possibly causes serious trouble in the vehicle performance, then the secondary battery needs to be replaced.

Generally, the connection between secondary battery 100 and load 200 can be represented by a model shown in FIG. 1. In FIG. 1, secondary battery 100 has OCV (open circuit voltage) 101 and Z (internal impedance) 102. Voltage V is the voltage of secondary battery 100, and current I is a current flowing through secondary battery 100.

If the value of OCV 101 is known, then the internal impedance of secondary battery 100 can be determined according to the equation Z=(OCV−V)/I. However, the value of OCV 101 is often uncertain.

Even if the value of OCV 101 is not known, the internal impedance of secondary battery 100 can be determined according to the equation Z=ΔV/ΔI. ΔI represents a change in the current in a short time, and ΔV represents a change in the voltage at the time (see JP-A No. 10-214643).

JP-A No. 2000-121710 discloses a method of determining degradation of a secondary battery. Specifically, in order to measure the internal impedance of a secondary battery, a charging and discharging current is caused to flow in a predetermined pattern, and a change in the voltage at the time is measured. The internal impedance of the secondary battery, is calculated based on the change in the voltage. Then, degradation of the secondary cell is judged based on the calculated result.

Patent Document 1: JP-A No. 10-214643
Patent Document 2: JP-A No. 2000-121710

DISCLOSURE OF THE INVENTION

Problems to be Solved by the Invention

According to the method of determining degradation as disclosed in JP-A No. 2000-121710, a current is caused to flow in a predetermined pattern for measuring the internal impedance. Therefore, each time the internal impedance is measured, the control of an overall system which employs the secondary battery is restricted. It is necessary to add a piece of hardware such as a dedicated charging and discharging circuit, etc.

Degradation of a secondary battery may be judged according to the measuring method disclosed in JP-A No. 10-214643, i.e., the method of measuring the internal impedance based on the equation Z=ΔV/ΔI. Specifically, the internal impedance is measured using the equation Z=ΔV/ΔI. Then, degradation of the secondary battery is judged based on the measured result.

According to the method of measuring the internal impedance simply using the equation Z=ΔV/ΔI, however, the internal impedance of a secondary battery mounted on an electric automobile, a hybrid automobile, or a fuel battery automobile cannot measured to a nicety. This drawback will be described below.

A secondary battery system mounted on an electric automobile, a hybrid automobile, or a fuel battery automobile has a charging and discharging current which may include a ripple component. Generally, the internal impedance of a secondary battery includes not only a resistive component, but also a capacitive component.

As the ripple component of the current is greater and the frequency of the current is higher, the voltage changes with a greater delay with respect to a change in the current. Therefore, the accuracy of the internal impedance calculated according to the equation Z=ΔV/ΔI is lowered.

The problem that a change in the voltage lags behind a change in the current is not limited a secondary battery system mounted on an electric automobile, a hybrid automobile, or a fuel battery automobile.

It is an object of the present invention to provide an internal impedance detecting apparatus and an internal impedance detecting method for detecting the internal impedance of a secondary battery with high accuracy.

Another object of the present invention is to provide a degradation degree detecting apparatus and a degradation degree detecting method for detecting a degradation degree of a secondary battery with high accuracy.

Means for Solving the Problems

In order to achieve the above objects, an internal impedance detecting apparatus for detecting an internal impedance of a secondary battery according to the present invention comprises a voltage detector for detecting a voltage of the secondary battery, a voltage change detector for detecting a change in the voltage within each of a plurality of detection times which have respective different time durations and include a common time, based on the voltage detected by the voltage detector, a current detector for detecting a current flowing through the secondary battery, a current change detector for detecting a change in the current within each of the detection times based on the current detected by the current detector, a processor for calculating a plurality of internal impedances by dividing voltage changes detected by the voltage change detector by current changes detected by the current change detector at the same detection times as the voltage changes, a judging unit for judging whether the internal impedances are reliable or not based on variations of the internal impedances calculated by the processor, and a generator for generating an internal impedance to be output based on the internal impedances only if the judging unit judges that the internal impedances are reliable.

A method of detecting an internal impedance of a secondary battery according to the present invention comprises the steps of detecting a voltage of the secondary battery, detecting a change in the voltage within each of a plurality of detection times which have respective different time durations and include a common time, based on the voltage detected in the step of detecting a voltage, detecting a current flowing through the secondary battery, detecting a change in the current within each of the detection times based on the current detected in the step of detecting a current, calculating a plurality of internal impedances by dividing voltage changes detected in the step of detecting a change in the voltage by current changes detected in the step of detecting a change in the current at the same detection times as the voltage changes, judging whether the internal impedances are reliable or not based on variations of the internal impedances calculated in the step of calculating a plurality of internal impedances, and generating an internal impedance to be output based on the internal impedances only if it is judged in the step of judging that the internal impedances are reliable.

According to the above invention, it is judged whether the internal impedances are reliable or not based on variations of the internal impedances at respective detection times. Only if it is judged that the internal impedances are reliable, an internal impedance to be output is generated based on the internal impedances.

Variations of the internal impedances are smaller as the delay of a change in the voltage with respect to a change in the current is smaller. The internal impedances determined by dividing the voltage change by the current change are more accurate as the delay of a change in the voltage with respect to a change in the current is smaller. Therefore, variations of the internal impedances are representative of the accuracy of the internal impedances.

According to the above invention, therefore, it is possible to generate an internal impedance to be output based on the highly reliable internal impedances. Accordingly, it is possible to detect an internal impedance to be output with high accuracy.

An internal impedance to be output is generated using the internal impedances which are used to determine reliability. Therefore, reliability is determined and an internal impedance to be output is generated, using the same internal impedances.

It is desirable to judge that the internal impedances are reliable if the difference between maximum and minimum values of the internal impedances calculated by the processor falls in a predetermined range, and to judge that the internal impedances are not reliable if the difference between the maximum and minimum values falls out of the predetermined range.

According to the above invention, reliability is judged based on the difference between maximum and minimum values of the internal impedances. Consequently, the judging process can be simpler than if reliability is determined based on all the internal impedances.

The internal impedances should desirably be calculated only if the current change is equal to or greater than a predetermined value.

According to the above invention, a plurality of internal impedances is calculated only when the current change is equal to or greater than a predetermined value. If the current change is smaller than the predetermined value, then the accuracy with which to calculate internal impedances may possibly be not maintained. Therefore, internal impedances whose accuracy is not maintained are prevented from being calculated.

It is desirable to judge whether the internal impedance to be output falls in a predetermined range or not, and to judge a malfunction based on the judged result.

According to the above invention, it is judged whether the internal impedance to be output falls in a predetermined range or not, and a malfunction is judged based on the judged result. If the predetermined range is set as a range depending on the specifications of the secondary battery, for example, then it is possible to determine a malfunction using the internal impedance to be output.

It is desirable to generate the internal impedance to be output as a charging internal impedance or a discharging internal impedance depending on the direction of the current.

According to the above invention, it is possible to detect a charging internal impedance and a discharging internal impedance with high accuracy. The above invention should preferably be applied to an apparatus for detecting an internal impedance of a secondary battery wherein a charging internal impedance and a discharging internal impedance are different from each other.

It is desirable to determine whether the direction of the current has changed in either one of the detection times or not. If it is judged that the direction of the current has changed in either one of the detection times, then it is desirable to discard the internal impedance to be output.

According to the above invention, it is possible to detect accurately an internal impedance of a secondary battery wherein a charging internal impedance and a discharging internal impedance are different from each other.

The internal impedance detecting apparatus should desirably further comprise a temperature rate-of-change detector for detecting a rate of change of the temperature of the secondary battery, and an SOC rate-of-change detector for detecting a rate of change of the SOC of the secondary battery, wherein the generator comprises an internal impedance generator for generating the internal impedance to be output based on the internal impedances only if the judging unit judges that the internal impedances are reliable, a storage unit for storing internal impedances to be output which have been generated in the past by the internal impedance generator, a selector for selecting an internal impedance to be output in the past from the storage unit based on the rate of change of the temperature detected by the temperature rate-of-change detector or the rate of change of the SOC detected by the SOC rate-of-change detector, and an average calculator for calculating an average of the internal impedance to be output in the past which has been selected by the selector and an internal impedance to be output which is newly generated by the internal impedance generator, and using the calculated result as a latest internal impedance to be output.

The method of detecting an internal impedance should desirably further comprise the steps of detecting a rate of change of the temperature of the secondary battery, and detecting a rate of change of the SOC of the secondary battery, wherein the step of generating an internal impedance to be output comprises the steps of generating the internal impedance to be output based on the internal impedances only if it is judged in the step of judging that the internal impedances are reliable, storing, in a storage unit, internal impedances to be output which have been generated in the past in the step of generating the internal impedance, selecting an internal impedance to be output in the past from the storage unit based on the rate of change of the temperature detected in the step of detecting a rate of change of the temperature or the rate of change of the SOC detected in the step of detecting a rate of change of the SOC, and calculating an average of the internal impedance to be output in the past which has been selected in the step of selecting an internal impedance and an internal impedance to be output which is newly generated in the step of generating the internal impedance, and using the calculated result as a latest internal impedance to be output.

According to the above invention, an internal impedance to be output in the past is selected based on the rate of change of the temperature or the rate of change of the SOC. An average of the selected internal impedance to be output in the past and the newly generated internal impedance to be output is calculated. The calculated result is used as a new internal impedance to be output.

The internal impedance changes depending on the temperature and the SOC. If the rate of change of the temperature or the rate of change of the SOC changes greatly, then the internal impedance varies greatly depending on the change. Therefore, by selecting an internal impedance in the past based on the rate of change of the temperature or the rate of change of the SOC, it is possible to remove an internal impedance in the past which has varied depending on a temperature change or an SOC change from internal impedances in the past which are used to calculate an average. Therefore, the accuracy of the average is prevented from being lowered.

An internal impedance to be output in the past should desirably be selected such that a time duration, including a time at which the internal impedance to be output in the past used to calculate the average is detected is longer as the rate of change of the temperature or the rate of change of the SOC is smaller.

According to the above invention, the accuracy of the average value is prevented from being lowered.

A degradation degree detecting apparatus for detecting a degradation degree of a secondary battery according to the present invention comprises the internal impedance detecting apparatus referred to above, a temperature detector for detecting the temperature of the secondary battery, an SOC detector for detecting the SOC of the secondary battery, a corrector for correcting the internal impedance to be output which has been generated by the internal impedance detecting apparatus, based on the temperature detected by the temperature detector and the SOC detected by the SOC detector, and a degradation degree detector for detecting a degradation degree of the secondary battery based on the internal impedance to be output which has been corrected by the corrector.

A method of detecting a degradation degree of a secondary battery according to the present invention comprises the steps of detecting the temperature of the secondary battery, detecting the SOC of the secondary battery, correcting an internal impedance to be output which has been generated by the above method of detecting an internal impedance, based on the temperature detected in the step of detecting the temperature and the SOC detected in the step of detecting the SOC, and detecting a degradation degree of the secondary battery based on the internal impedance to be output which has been corrected in the step of correcting an internal impedance to be output.

According to the above invention, the degradation degree of the secondary battery is detected based on the internal impedances to be output which are detected with high accuracy. Therefore, the degradation degree of the secondary battery can be detected with high accuracy.

Advantages of the Invention

According to the above invention, it is judged whether the internal impedances are reliable or not based on variations of the internal impedances at respective detection times. Only if it is judged that the internal impedances are reliable, an internal impedance to be output is generated based on the internal impedances.

Variations of the internal impedances are smaller as the delay of a change in the voltage with respect to a change in the current is smaller. The internal impedances determined by dividing the voltage change by the current change are more accurate as the delay of a change in the voltage with respect to a change in the current is smaller. Therefore, variations of the internal impedances are representative of the accuracy of the internal impedances.

According to the present invention, therefore, it is possible to generate an internal impedance to be output based on the highly reliable internal impedances. Accordingly, it is possible to detect an internal impedance to be output with high accuracy.

An internal impedance to be output is generated using the internal impedances which are used to determine reliability. Therefore, reliability is determined and an internal impedance to be output is generated, using the same internal impedances.

Figure 1:
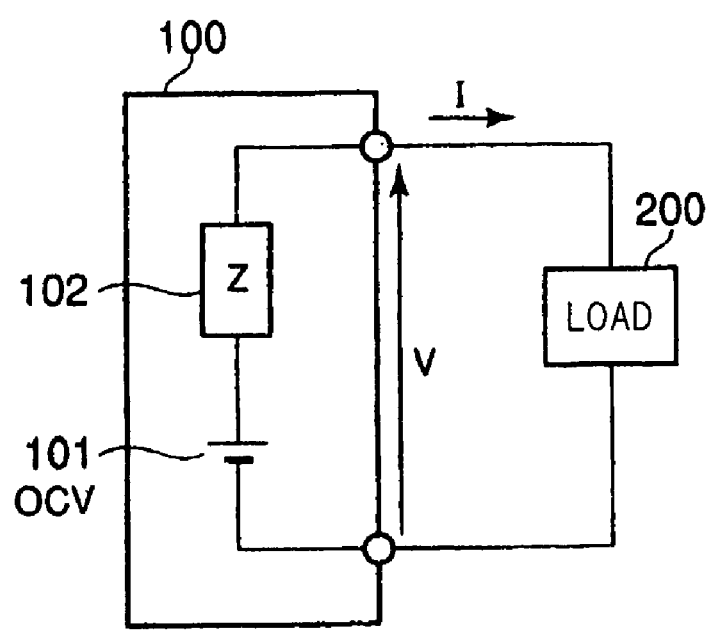
FIG. 1 is a circuit diagram showing a connection between a secondary battery and a load.

DESCRIPTION OF REFERENCE CHARACTERS 1 internal impedance detecting apparatus
101 timer
102 voltage detector
103 voltage change detector
104 current detector
105 current change detector
106 processor
107 judging unit
108 energization direction detector
109 generator
109a internal impedance generator
109b storage unit
109c selector
109d average calculator
110 temperature detector
111 temperature rate-of-change detector 112 SOC detector
113 SOC rate-of-change detector
2 corrector
3 degradation degree detector
4 secondary battery
5 load

BEST MODE FOR CARRYING OUT THE INVENTION

An embodiment of the present invention will be described below with reference to the drawings.

Figure 2:
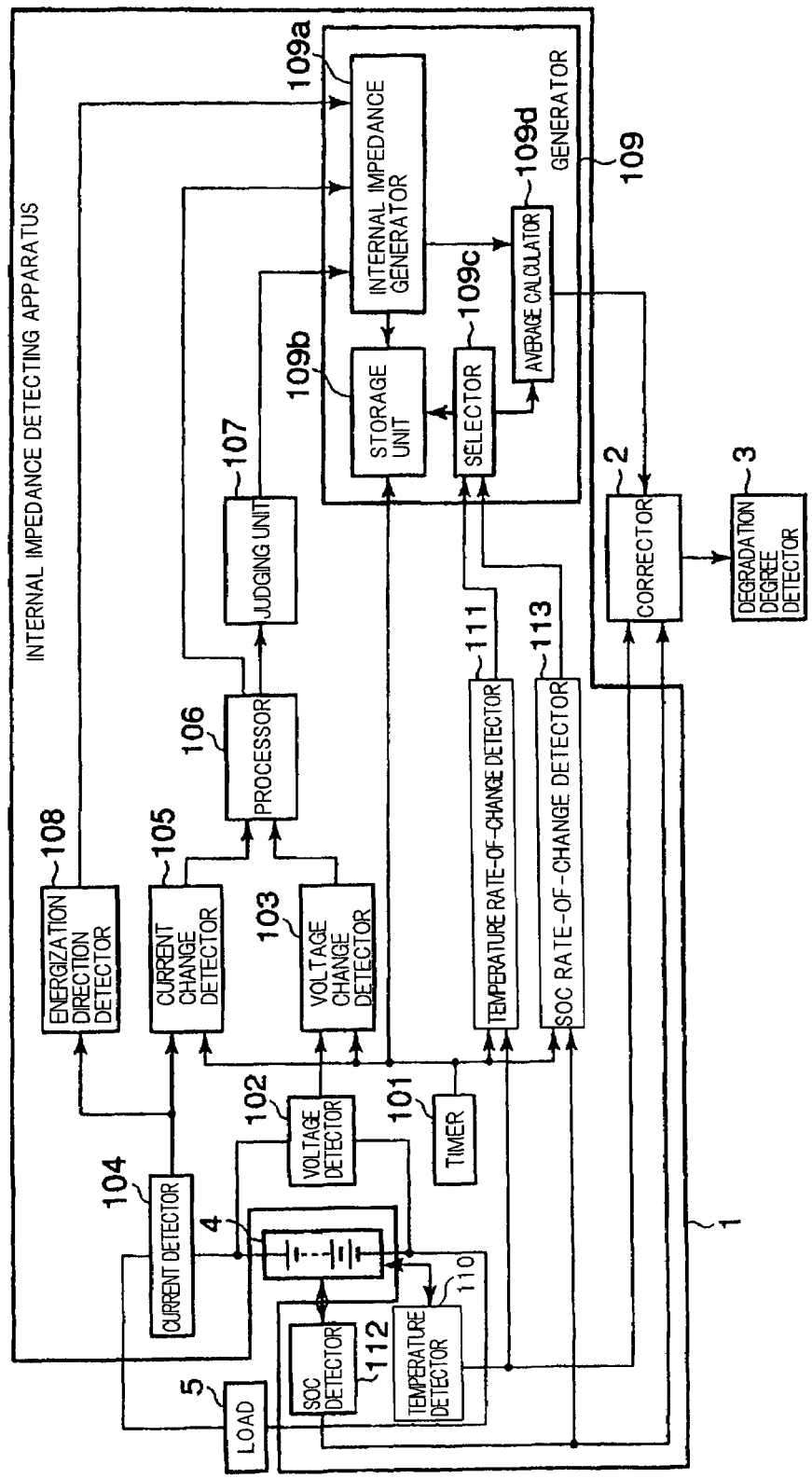
FIG. 2 is a block diagram of a degradation detecting apparatus according to an embodiment of the present invention.

FIG. 2 is a block diagram of a degradation detecting apparatus according to an embodiment of the present invention.

As shown in FIG. 2, the degradation detecting apparatus includes internal impedance detecting apparatus 1 according to the embodiment of the present invention, corrector 2, and degradation degree detector 3.

Internal impedance detecting apparatus 1 comprises timer 101, voltage detector 102, voltage change detector 103, current detector 104, current change detector 105, processor 106, judging unit 107, energization direction detector 108, generator 109, temperature detector 110, temperature rate-of-change detector 111, SOC detector 112, and SOC rate-of-change detector 113. Generator 109 comprises internal impedance generator 109a, storage unit 109b, selector 109c, and average calculator 109d.

Timer 101 outputs time information.

Voltage detector 102 detects a voltage of secondary battery 4.

Secondary battery 4 is a battery that can be charged and discharged, and serves as an electric power supply for load 5. In the present embodiment, secondary battery 4 is mounted on a hybrid automobile, an electric automobile, or a fuel battery automobile, and is used as an electric power supply for supplying electric power required to start the engine and drive the vehicle. In the present embodiment, load 5 is a load for driving the vehicle. Secondary battery 4 is charged and discharged such that its SOC is kept within a predetermined range. Secondary battery 4 is charged and discharged under the control of a battery controller (not shown).

Voltage change detector 103 detects a change in the voltage within each of a plurality of detection times which have respective different time durations and include a common time, based on the voltage detected by voltage detector 102 and an output from timer 101. Voltage change detector 103 has a storage area (not shown) for storing the voltage detected by voltage detector 102 in association with a detection time thereof.

Current detector 104 detects a current flowing through secondary battery 4.

Current change detector 105 detects a change in the current within each of a plurality of detection times, which are the same as the detection times employed by voltage change detector 103, based on outputs from current detector 104 and timer 101. Current change detector 105 has a storage area (not shown) for storing the current detected by current detector 104 in association with a detection time thereof.

Processor 106 divides voltage changes detected by voltage change detector 103 by current changes detected by current change detector 105 at the same detection times as the voltage changes, thereby calculating a plurality of internal impedances. Processor 106 outputs the internal impedances to judging unit 107 and generator 109.

Judging unit 107 checks variations of the internal impedances received from processor 106. Based on the checked results, judging unit 107 judges whether the internal impedances are reliable or not. Judging unit 107 outputs the judged results to generator 109.

According to the present embodiment, if the difference between maximum and minimum values of the internal impedances falls within a predetermined range, then judging unit 107 determines that the internal impedances are reliable. If the difference between the maximum and minimum values falls outside of the predetermined range, then judging unit 107 determines that the internal impedances are not reliable.

Energization direction detector 108 detects the direction of a current (specifically, a charging direction or a discharging direction) flowing through secondary battery 4 based on the current detected by current detector 104. Energization direction detector 108 outputs the detected result to generator 109.

Generator 109 generates an internal impedance to be output based on the internal impedances only if judging unit 107 determines that the internal impedances are reliable.

Specifically, internal impedance generator 109a generates an internal impedance to be output based on the internal impedances only if judging unit 107 determines that the internal impedances are reliable.

Internal impedance generator 109a should preferably generate the internal impedance to be output as a charging internal impedance or a discharging internal impedance depending on the direction of the current detected by energization direction detector 108.

Storage unit 109b stores the internal impedances to be output which have been generated by internal impedance generator 109a. Stated otherwise, storage unit 109b stores the internal impedances to be output which have been generated in the past by internal impedance generator 109a. According to the present embodiment, storage unit 109b stores the internal impedances to be output in association with times (detection times) at which the internal impedances to be output have been received.

If internal impedance generator 109a alternatively outputs a charging internal impedance or a discharging internal impedance, then storage unit 109b should preferably have a charging internal impedance storage unit (not shown) and a discharging internal impedance storage unit (not shown). Storage unit 109b stores charging internal impedances in the charging internal impedance storage unit, and discharging internal impedances in the discharging internal impedance storage unit.

Temperature detector 110 detects the temperature of secondary battery 4. Temperature rate-of-change detector 111 detects a rate of change of the temperature of secondary battery 4 based on the temperature detected by temperature detector 110 and the output from timer 101.

SOC detector 112 detects the SOC of secondary battery 4. SOC rate-of-change detector 113 detects a rate of change of the SOC of secondary battery 4 based on the SOC of secondary battery 4 detected by SOC detector 112 and the output from timer 101.

Selector 109c selects an internal impedance to be output in the past from storage unit 109b based on the rate of change of the temperature detected by temperature rate-of-change detector 111 or the rate of change of the SOC detected by SOC rate-of-change detector 113.

Average calculator 109d calculates an average of the internal impedance to be output in the past selected by selector 109c and the latest internal impedance to be output which has been generated by internal impedance generator 109a. Average calculator 109d outputs the calculated result as a latest internal impedance to be output.

According to the present embodiment, selector 109c selects an internal impedance to be output in the past such that a time duration, including the detection time of the selected internal impedance to be output in the past, is longer as the rate of change of the temperature detected by temperature rate-of-change detector 111 or the rate of change of the SOC detected by SOC rate-of-change detector 113 is smaller.

For example, if the rate of change of the temperature is "A", then selector 109c selects an internal impedance to be output in the past such that the detection time of the internal impedance to be output in the past is included in a time duration from the present time to 10 minutes prior to the present time. If the rate of change of the temperature is "B" (B<A), then selector 109c selects an internal impedance to be output in the past such that the detection time of the internal impedance to be output in the past is included in a time duration from the present time to 15 minutes prior to the present time.

For example, if the rate of change of the SOC is "C", then selector 109c selects an internal impedance to be output in the past such that the detection time of the internal impedance to be output in the past is included in a time duration from the present time to 10 minutes prior to the present time. If the rate of change of the SOC is "D" (D<C), then selector 109c selects an internal impedance to be output in the past such that the detection time of the internal impedance to be output in the past is included in a time duration from the present time to 15 minutes prior to the present time.

Corrector 2 corrects the internal impedance to be output which has been generated by internal impedance detecting apparatus 1 based on the temperature detected by temperature detector 110 and the SOC detected by the SOC detector 112.

Degradation degree detector 3 detects the degradation degree of secondary battery 4 based on the internal impedance to be output which is corrected by corrector 2.

Operation will be described below.

Figure 3:
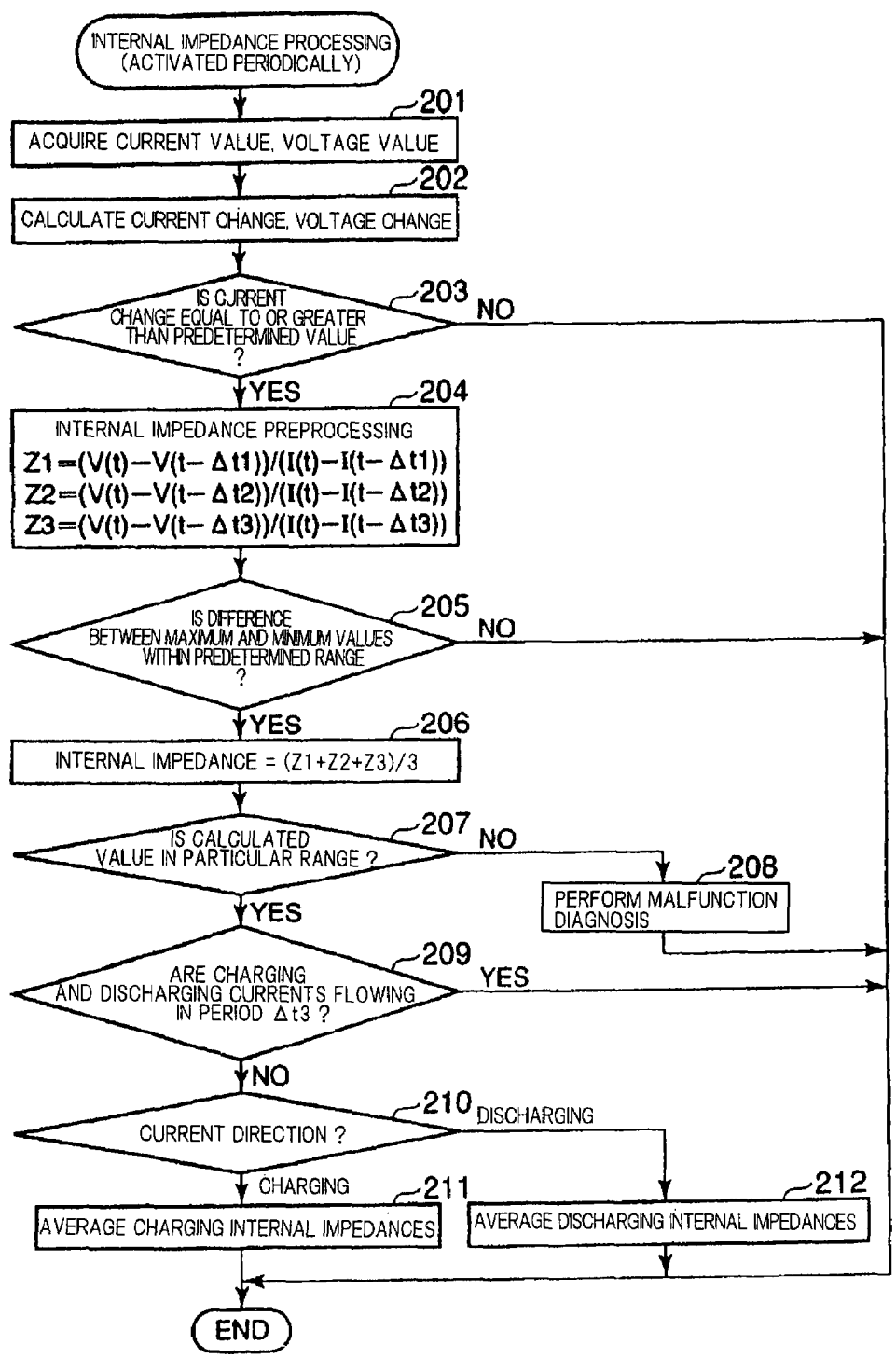
FIG. 3 is a flowchart illustrative of operation of an internal impedance detecting apparatus shown in FIG. 2.

FIG. 3 is a flowchart illustrative of operation of internal impedance detecting apparatus 1 shown in FIG. 2. Operation of internal impedance detecting apparatus 1 will be described below with reference to FIG. 3. Operation shown in FIG. 3 is performed periodically.

In step 201, when the output from timer 101 indicates a certain time, voltage change detector 103 acquires a voltage value detected by voltage detector 102 for a predetermined time. Voltage change detector 103 stores the acquired voltage value in its own storage area in association with the time output from timer 101.

In step 201, when the output from timer 101 indicates a certain time, current change detector 105 acquires a current value detected by current detector 104 for a predetermined time. Current change detector 105 stores the acquired current value in its own storage area in association with the time output from timer 101.

After step 201, voltage change detector 103 and current change detector 105 execute step 202.

In step 202, voltage change detector 103 calculates a change in the voltage in within each of a plurality of detection times which have respective different time durations and include a common time, based on the voltage value and its time stored in its own storage area. Voltage change detector 103 outputs the calculated result to processor 106.

In step 202, current change detector 105 calculates a change in the current in within each of a plurality of detection times which are the same as the detection times employed by voltage change detector 103, based on the current value and its time stored in its own storage area. Current change detector 105 also calculates a current change ($\Delta I$) in unit time ($\Delta t$). Current change detector 105 outputs the calculated results to processor 106.

Figure 4:
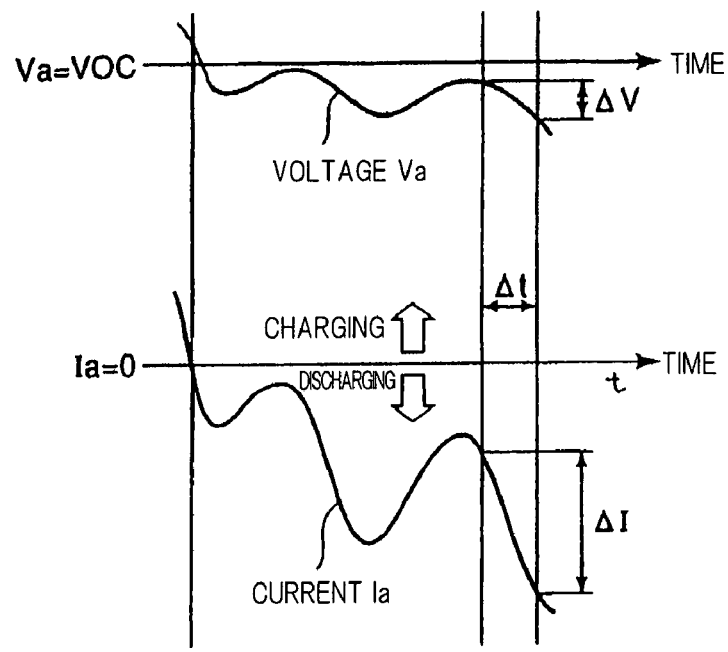
FIG. 4 is a diagram illustrative of operation of the internal impedance detecting apparatus shown in FIG. 2.

FIG. 4 is a diagram showing an example of the current change ($\Delta I$) in unit time ($\Delta t$). In FIG. 4, voltage Va represents the voltage of secondary battery 4, and current Ia the current flowing through secondary battery 4. VOC represents a open circuit voltage.

Processor 106 executes step 203 when it receives the voltage change from voltage change detector 103 and the current change from current change detector 105.

In step 203, processor 106 determines whether or not the current change ($\Delta I$) in unit time ($\Delta t$) is equal to or greater than a predetermined value.

If the current change ($\Delta I$) is smaller than the predetermined value, then the accuracy with calculating internal impedances cannot be maintained. Therefore, when the current change ($\Delta I$) is smaller than the predetermined value, processor 106 does not calculate internal impedances, and finishes its operation to calculate internal impedances. Therefore, the output from generator 109 continues to be of a preceding value.

If the current change ($\Delta I$) is equal to or greater than the predetermined value, then processor 106 executes step 204.

In step 204, processor 106 divides voltage changes received from voltage change detector 103 by current changes calculated by current change detector 105 at the same detection times as the voltage changes, thereby calculating a plurality of internal impedances. In FIG. 3, the processing operation performed by processor 106 in step 204 is referred to internal impedance preprocessing.

Figure 5:
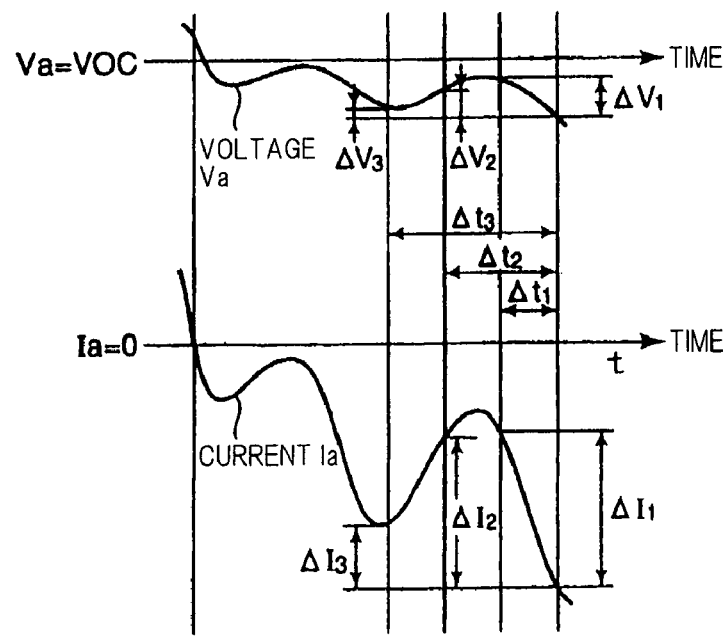
FIG. 5 is a diagram illustrative of operation of the internal impedance detecting apparatus shown in FIG. 2.

FIG. 5 is a diagram showing an example of step 204. In FIG. 5 those parts which are identical to those shown in FIG. 4 are denoted by identical reference characters.

Processor 106 calculates an internal impedance a plurality of times in different time durations as shown in FIG. 5. In the example shown in FIG. 5, there are three types of time durations $\Delta t1$, $\Delta t2$, $\Delta t3$. Processor 106 calculates internal impedances Z1, Z2, Z3 as follows:

$$Z1 = \Delta V1/\Delta I1 = (V(t) - V(t-\Delta t1))/(I(t) - I(t-\Delta t1)),$$

$$Z2 = \Delta V2/\Delta I2 = (V(t) - V(t-\Delta t2))/(I(t) - I(t-\Delta t2)),$$

$$Z3 = \Delta V3/\Delta I3 = (V(t) - V(t-\Delta t3))/(I(t) - I(t-\Delta t3)).$$

The plural detection times are not limited to three detection times, but may be changed. The plural internal impedances are not limited to three internal impedances, but may be changed depending on the number of detection times. $\Delta t1$ should desirably be unit time ($\Delta t$).

In step 204, the plural internal impedances (Z1, Z2, and Z3) are obtained at time t.

Processor 106 outputs the calculated internal impedances (Z1, Z2, and Z3) to judging unit 107 and internal impedance generator 109a.

Judging unit 107 carries out step 205 when it receives the internal impedances from processor 106.

In step 205, judging unit 107 determines whether the difference between maximum and minimum values of the internal impedances calculated by processor 106 falls within a predetermined range or not. Judging unit 107 outputs the determined result to internal impedance generator 109a.

If the difference between the maximum and minimum values falls within the predetermined range, then judging unit 107 determines that the delay of the voltage with respect to the current is almost negligible. In this case, the judging unit 107 judges that the internal impedances calculated by processor 106 are reliable.

If the difference between the maximum and minimum values falls outside of the predetermined range, then judging unit 107 determines that the delay of the voltage with respect to the current is large. In this case, the judging unit 107 judges that the internal impedances calculated by processor 106 are not reliable.

Internal impedance generator 109*a* executes step 206 only if the judging unit 107 judges that the internal impedances are reliable.

In step 206, internal impedance generator 109*a* generates an internal impedance to be output based on the plural internal impedances received from processor 106.

In the present embodiment, internal impedance generator 109*a* calculates an average of the plural internal impedances received from processor 106. Internal impedance generator 109*a* uses the average as an internal impedance to be output. Internal impedance generator 109*a* may use a desired one of the internal impedances as an internal impedance to be output.

If the judging unit 107 judges that the internal impedances are not reliable, then internal impedance generator 109*a* continuously outputs the internal impedance to be output which has been calculated in the preceding cycle.

After step 206, internal impedance generator 109*a* executes step 207.

In step 207, internal impedance generator 109*a* determines whether the internal impedance to be output calculated in step 206 is included in a particular range or not.

If the internal impedance to be output is not included in the particular range, then internal impedance generator 109*a* executes step 208. If the internal impedance to be output is included in the particular range, then internal impedance generator 109*a* executes step 209.

In step 208, internal impedance generator 109*a* performs a malfunction diagnosis. The malfunction diagnosis will be described below.

The internal impedance of a secondary battery varies depending on the temperature of the secondary battery, the SOC of the secondary battery, the degraded state of the secondary battery, etc. However, the varying range of the internal impedance of the secondary battery may be defined in advance according to the specifications of the secondary battery.

If the internal impedance to be output calculated in step 206 suddenly shifts out of the varying range while internal impedances are being periodically calculated, then it is highly likely that the detection of a current or a voltage has suffered an error. In this case, internal impedance generator 109*a* discards the internal impedance to be output which has been calculated in step 206, and continuously outputs the internal impedance to be output which has been calculated in the preceding cycle.

If the internal impedance to be output calculated in step 206 shifts out of the varying range continuously for a given time, then internal impedance generator 109*a* judges that secondary battery 4 or a current path is malfunctioning.

In step 209, internal impedance generator 109*a* determines whether the direction of the current has changed in either one of the detection times or not, based on the detected result from energization direction detector 108.

According to the present embodiment, since Δt3 includes all the detection times, internal impedance generator 109*a* determines whether both a charging current and a discharging current have flowed in the period Δt3 or not. Stated otherwise, internal impedance generator 109*a* determines whether the direction of the current has changed in the period Δt3 or not.

If internal impedance generator 109*a* judges that the direction of the current has changed at any one of the detection times, then internal impedance generator 109*a* discards the calculated internal impedance to be output. This operation is effective if the magnitude of the internal impedance of secondary battery 4 differs when it is charged and discharged. If the magnitude of the internal impedance of secondary battery 4 does not differ when it is charged and discharged, then this operation (step 209) may not be performed.

Internal impedance generator 109*a* executes step 210 if it judges that the direction of the current has not changed at any one of the detection times.

In step 210, internal impedance generator 109*a* determines whether the direction of the current is a direction to charge secondary battery 4 or a direction to discharge secondary battery 4, based on the detected result from energization direction detector 108.

If the direction of the current is a direction to charge secondary battery 4, then internal impedance generator 109*a* uses the calculated internal impedance to be output as a charging internal impedance. Internal impedance generator 109*a* outputs the charging internal impedance to average calculator 109*d*.

Internal impedance generator 109*a* stores the charging internal impedance in storage unit 109*b* (specifically, the charging internal impedance storage unit). At this time, using the output from timer 101, storage unit 109*b* stores the charging internal impedance in association with the time (detection time) at which it has received the charging internal impedance.

If the direction of the current is a direction to discharge secondary battery 4, then internal impedance generator 109*a* uses the calculated internal impedance to be output as a discharging internal impedance. Internal impedance generator 109*a* outputs the discharging internal impedance to average calculator 109*d*.

Internal impedance generator 109*a* stores the discharging internal impedance in storage unit 109*b* (specifically, the discharging internal impedance storage unit). At this time, using the output from timer 101, storage unit 109*b* stores the discharging internal impedance in association with the time (detection time) at which it has received the discharging internal impedance.

Average calculator 109*d* executes step 211 when it receives the charging internal impedance. Average calculator 109*d* executes step 212 when it receives the discharging internal impedance.

In step 211, average calculator 109*d* performs a charging internal impedance averaging process based on the charging internal impedance received from internal impedance generator 109*a* and charging internal impedances in the past stored in storage unit 109*b* (specifically, the charging internal impedance storage unit).

In step 212, average calculator 109*d* performs a discharging internal impedance averaging process based on the discharging internal impedance received from internal impedance generator 109*a* and discharging internal impedances in the past stored in storage unit 109*b* (specifically, the discharging internal impedance storage unit).

The averaging process performed by average calculator 109*d* will be described below. The charging internal impedance and the discharging internal impedance will hereinafter be referred to as an internal impedance to be output.

When a microcomputer calculates an internal impedance, the accuracy of the calculated internal impedance is lowered by, in addition to a delay of the voltage with respect to the current, exogenous noise, the accuracy of the current detector and the voltage detector, and a quantization error of the detected signals. As a consequence, the calculated internal impedances tend to vary.

According to the present embodiment, since average calculator 109d performs an averaging process in step 211 or step 212 based on the characteristics that the value of the internal impedance does not change abruptly, it makes the calculates results reliable. Average calculator 109d performs the averaging process according to a moving average process or a weighted moving averaging process, for example. If an apparatus (e.g., a battery controller) that is different from internal impedance detecting apparatus 1 controls the current of secondary battery 4, internal impedance detecting apparatus 1 is unable to recognize, in advance, a time to be able to calculate an internal impedance to be output.

The internal impedance of secondary battery 4 varies depending o the temperature of secondary battery 4 and the SOC of secondary battery 4. According to the present embodiment, therefore, a time duration required for averaging internal impedances, or stated otherwise, a predetermined time used to calculate an average of internal impedances generated in the predetermined time, is established depending on the rate of change of the temperature and/or the rate of change of the SOC. For example, if the rate of change of the temperature or the rate of change of the SOC is small, then the time duration (the predetermined time described above) required for averaging internal impedances is set to a long value, and if the rate of change is large, the time duration (the predetermined time described above) is set to a short value.

For example, selector 109c selects an internal impedance to be output in the past from storage unit 109b based on the rate of change of the temperature detected by temperature rate-of-change detector 111 or the rate of change of the SOC detected by SOC rate-of-change detector 113.

More specifically, selector 109c selects an internal impedance to be output in the past such that a shortest time duration (the predetermined time), including the time at which the internal impedance to be output in the past used to calculate the average is detected, is longer as the rate of change of the temperature detected by temperature rate-of-change detector 111 or the rate of change of the SOC detected by SOC rate-of-change detector 113 is smaller.

Average calculator 109d calculates an average of the internal impedance to be output in the past selected by selector 109c and the internal impedance to be output received from internal impedance generator 109a.

Average calculator 109d uses the calculated result as a latest internal impedance to be output.

Average calculator 109d outputs the latest internal impedance to be output to corrector 2.

Corrector 2 corrects the internal impedance to be output which has been generated by internal impedance detecting apparatus 1 based on the temperature detected by temperature detector 110 and the SOC detected by SOC detector 112.

Correction performed by corrector 2 will be described below.

The internal impedance of secondary battery 4 varies depending on the temperature of secondary battery 4 and the SOC of secondary battery 4.

Corrector 2 corrects the internal impedance to be output (the latest internal impedance to be output) calculated by internal impedance detecting apparatus 1 based on the temperature and the SOC.

For example, corrector 2 has a first table representing the relationship between temperatures and internal impedances when the SOC is constant. Corrector 2 reads internal impedance $Zt0$ at a reference temperature and internal impedance $Zt1$ at the temperature of secondary battery 4 upon processing operation from the first table. Then, corrector 2 calculates $Zt0/Zt1$ and multiplies the calculated result by the internal impedance to be output (the latest internal impedance to be output) calculated by internal impedance detecting apparatus 1, thereby performing temperature correction.

Corrector 2 also has a second table representing the relationship between SOCs and internal impedances when the temperature is constant. Corrector 2 reads internal impedance $Zs0$ at a reference SOC and internal impedance $Zs1$ at the SOC of secondary battery 4 upon processing operation from the second table. Then, corrector 2 calculates $Zs0/Zs1$ and multiplies the calculated result by the internal impedance to be output (the latest internal impedance to be output) calculated by internal impedance detecting apparatus 1, thereby performing SOC correction.

Corrector 2 outputs the corrected internal impedance to be output to degradation degree detector 3.

Degradation degree detector 3 detects a degradation degree of secondary battery 4 based on the internal impedance to be output which has been corrected by corrector 2.

A process of determining a degradation degree which is performed by degradation degree detector 3 will be described below.

Degradation degree detector 3 determines a degradation degree of secondary battery 4 based on a rate of increase of the internal impedance from the internal impedance at the time a brand-new secondary battery is shipped. An allowable range for the rate of increase differs from system to system. For example, degradation degree detector 3 judges that the service life of secondary battery 4 comes to an end when the internal impedance value is 1.5 times the internal impedance at the time a brand-new secondary battery is shipped.

If it is assumed that the corrected internal impedance to be output which has been received from corrector 2 is represented by ZC, the internal impedance at the time the service life comes to an end at the reference temperature and the reference SOC by ZL, and the internal impedance at the time a brand-new secondary battery is shipped at the reference temperature and the reference SOC by ZN, then degradation degree detector 3 calculates a degradation degree according to the following equation: Degradation degree (%)=((ZC−ZN)/(ZL−ZN))×100.

According to the above equation, the degradation degree is 0% when a brand-new secondary battery is shipped and 100% when the service life comes to an end.

According to the present embodiment, it is determined whether the internal impedances are reliable or not based on variations of the internal impedances at a plurality of detection times. Only if it is judged that the internal impedances are reliable, an internal impedance to be output is generated based on the internal impedances.

Therefore, it is possible to generate an internal impedance to be output based on the highly reliable internal impedances. Accordingly, it is possible to detect an internal impedance to be output with high accuracy.

An internal impedance to be output is generated using the internal impedances which are used to determine reliability. Therefore, reliability is determined and an internal impedance to be output is generated, using the same internal impedances.

If reliability is judged based on the difference between maximum and minimum values of the internal impedances, then the judging process can be simpler than if reliability is determined based on all the internal impedances.

If a plurality of internal impedances are calculated only when the current change is equal to or greater than a predetermined value, then internal impedances whose accuracy is not maintained are prevented from being calculated.

If it is determined whether an internal impedance to be output falls in a predetermined range or not and-a malfunction is determined based on the determined result, then it is possible to determine a malfunction using the internal impedance to be output by setting the predetermined range as a range depending on the specifications of the secondary battery, for example.

Even with a secondary battery whose charging internal impedance and discharging internal impedance are different from each other, the charging internal impedance and the discharging internal impedance can be detected with high accuracy.

According to the present embodiment, by selecting an internal impedance in the past based on the rate of change of the temperature or the rate of change of the SOC, it is possible to remove an internal impedance in the past which has varied depending on a temperature change or an SOC change from internal impedances in the past which are used to calculate an average. Therefore, the accuracy of the average is prevented from being lowered.

According to the present embodiment, furthermore, the degradation degree of the secondary battery is detected based on an internal impedance to be output which is of high detection accuracy. Therefore, the degradation degree of the secondary battery can be detected with high accuracy.

In the above embodiment, the illustrated arrangement is by way of example only. The present invention should not be limited to the illustrated arrangement.

For example, secondary battery 4 is not limited to a battery to be mounted on a hybrid automobile, an electric automobile, or a fuel battery automobile, but may be a secondary battery for use in any desired secondary battery system.

The invention claimed is:

1. An internal impedance detecting apparatus for detecting an internal impedance of a secondary battery, comprising:
   a voltage detector for detecting a voltage of said secondary battery;
   a voltage change detector for detecting a change in the voltage within each of a plurality of detection times which have respective different time durations and include a common time, based on the voltage detected by said voltage detector;
   a current detector for detecting a current flowing through said secondary battery;
   a current change detector for detecting a change in the current within each of said detection times based on the current detected by said current detector;
   a processor for calculating a plurality of internal impedances by dividing voltage changes detected by said voltage change detector by current changes detected by said current change detector at the same detection times as the voltage changes;
   a judging unit for judging whether the internal impedances are reliable or not based on variations of the internal impedances calculated by said processor; and
   a generator for generating an internal impedance to be output based on the internal impedances only if said judging unit judges that said internal impedances are reliable.

2. The internal impedance detecting apparatus according to claim 1, wherein said judging unit judges that said internal impedances are reliable if the difference between maximum and minimum values of the internal impedances calculated by said processor falls in a predetermined range, and judges that said internal impedances are not reliable if the difference between said maximum and minimum values falls out of said predetermined range.

3. The internal impedance detecting apparatus according to claim 1, wherein said processor calculates said internal impedances only if the current change detected by said current change detector is equal to or greater than a predetermined value.

4. The internal impedance detecting apparatus according to claim 1, wherein said generator judges whether said internal impedance to be output falls in a predetermined range or not, and judges a malfunction based on the judged result.

5. The internal impedance detecting apparatus according to claim 1, wherein said secondary battery can be charged and discharged, further comprising:
   an energization direction detector for detecting a direction of the current based on the current detected by said current detector;
   wherein said generator generates the internal impedance to be output as a charging internal impedance or a discharging internal impedance depending on the direction of the current detected by said energization direction detector.

6. The internal impedance detecting apparatus according to claim 5, wherein said generator determines whether the direction of said current has changed in either one of the detection times or not, based on the direction of the current detected by said energization direction detector, and discards said internal impedance to be output if said generator judges that the direction of said current has changed in either one of said detection times.

7. The internal impedance detecting apparatus according to claim 1, further comprising:
   a temperature rate-of-change detector for detecting a rate of change of the temperature of said secondary battery; and
   an SOC rate-of-change detector for detecting a rate of change of the SOC of said secondary battery;
   wherein said generator comprises:
   an internal impedance generator for generating said internal impedance to be output based on said internal impedances only if said judging unit judges that said internal impedances are reliable;
   a storage unit for storing internal impedances to be output which have been generated in the past by said internal impedance generator;
   a selector for selecting an internal impedance to be output in the past from said storage unit based on the rate of change of the temperature detected by said temperature rate-of-change detector or the rate of change of the SOC detected by said SOC rate-of-change detector; and
   an average calculator for calculating an average of the internal impedance to be output in the past which has been selected by said selector and an internal impedance to be output which is newly generated by said internal impedance generator, and using the calculated result as a latest internal impedance to be output.

8. The internal impedance detecting apparatus according to claim 7, wherein said selector selects an internal impedance to be output in the past such that a time duration, including a time at which the internal impedance to be output in the past used to calculate the average is detected, is longer as the rate of change of the temperature detected by said temperature rate-of-change detector or the rate of change of the SOC detected by said SOC rate-of-change detector is smaller.

9. A degradation degree detecting apparatus for detecting a degradation degree of a secondary battery, comprising:

an internal impedance detecting apparatus comprising a voltage detector for detecting a voltage of said secondary battery; a voltage change detector for detecting a change in the voltage within each of a plurality of detection times which have respective different time durations and include a common time, based on the voltage detected by said voltage detector; a current detector for detecting a current flowing through said secondary battery; a current change detector for detecting a change in the current within each of said detection times based on the current detected by said current detector; a processor for calculating a plurality of internal impedances by dividing voltage changes detected by said voltage change detector by current changes detected by said current change detector at the same detection times as the voltage changes; a judging unit for judging whether the internal impedances are reliable or not based on variations of the internal impedances calculated by said processor; and a generator for generating an internal impedance to be output based on the internal impedances only if said judging unit judges that said internal impedances are reliable;

a temperature detector for detecting the temperature of said secondary battery;

an SOC detector for detecting the SOC of said secondary battery;

a corrector for correcting the internal impedance to be output which has been generated by said internal impedance detecting apparatus, based on the temperature detected by said temperature detector and the SOC detected by said SOC detector; and a degradation degree detector for detecting a degradation degree of said secondary battery based on the internal impedance to be output which has been corrected by said corrector.

10. A method of detecting an internal impedance of a secondary battery, comprising the steps of:

detecting a voltage of said secondary battery;

detecting a change in the voltage within each of a plurality of detection times which have respective different time durations and include a common time, based on the voltage detected in said step of detecting a voltage;

detecting a current flowing through said secondary battery;

detecting a change in the current within each of said detection times based on the current detected in said step of detecting a current;

calculating a plurality of internal impedances by dividing voltage changes detected in said step of detecting a change in the voltage by current changes detected in said step of detecting a change in the current at the same detection times as the voltage changes;

judging whether the internal impedances are reliable or not based on variations of the internal impedances calculated in said step of calculating a plurality of internal impedances; and generating an internal impedance to be output based on the internal impedances only if it is judged in said step of judging that said internal impedances are reliable.

11. The method according to claim 10, wherein said step of judging comprises the steps of judging that said internal impedances are reliable if the difference between maximum and minimum values of the internal impedances calculated in said step of calculating a plurality of internal impedances falls in a predetermined range, and judging that said internal impedances are not reliable if the difference between said maximum and minimum values falls out of said predetermined range.

12. The method according to claim 10, wherein said step of calculating a plurality of internal impedances comprises the step of calculating said internal impedances only if the current change detected in said step of detecting a change in the current is equal to or greater than a predetermined value.

13. The method according to claim 10, wherein said step of generating an internal impedance to be output comprises the steps of judging whether said internal impedance to be output falls in a predetermined range or not, and judging a malfunction based on the judged result.

14. The method according to claim 10, wherein said secondary battery can be charged and discharged, further comprising the step of:

detecting a direction of the current based on the current detected in said step of detecting a current;

wherein said step of generating an internal impedance to be output comprises the step of generating the internal impedance to be output as a charging internal impedance or a discharging internal impedance depending on the direction of the current detected in said step of detecting a direction of the current.

15. The method according to claim 14, wherein said step of generating an internal impedance to be output comprises the steps of determining whether the direction of said current has changed in either one of the detection times, based on the direction of the current detected in said step of detecting a direction of the current, and discarding said internal impedance to be output if it is judged that the direction of said current has changed in either one of said detection times.

16. The method according to claim 10, further comprising the steps of:

detecting a rate of change of the temperature of said secondary battery; and detecting a rate of change of the SOC of said secondary battery;

wherein said step of generating an internal impedance to be output comprises the steps of:

generating said internal impedance to be output based on said internal impedances only if it is judged in said step of judging that said internal impedances are reliable;

storing, in a storage unit, internal impedances to be output which have been generated in the past in said step of generating said internal impedance;

selecting an internal impedance to be output in the past from said storage unit based on the rate of change of the temperature detected in said step of detecting a rate of change of the temperature or the rate of change of the SOC detected in said step of detecting a rate of change of the SOC; and calculating an average of the internal impedance to be output in the past which has been selected in said step of selecting an internal impedance and an internal impedance to be output which is newly generated in said step of generating said internal impedance, and using the calculated result as a latest internal impedance to be output.

17. The method according to claim 16, wherein said step of selecting an internal impedance comprises the step of selecting an internal impedance to be output in the past such that a time duration, including a time at which the internal impedance to be output in the past used to calculate the average is detected, is longer as the rate of change of the temperature detected in said step of detecting a rate of change of the temperature or the rate of change of the SOC detected in said step of detecting a rate of change of the SOC is smaller.

18. A method of detecting a degradation degree of a secondary battery, comprising the steps of:

detecting a voltage of said secondary battery;

detecting a change in the voltage within each of a plurality of detection times which have respective different time durations and include a common time, based on the voltage detected in said step of detecting a voltage;

detecting a current flowing through said secondary battery;

detecting a change in the current within each of said detection times based on the current detected in said step of detecting a current;

calculating a plurality of internal impedances by dividing voltage changes detected in said step of detecting a change in the voltage by current changes detected in said step of detecting a change in the current at the same detection times as the voltage changes;

judging whether the internal impedances are reliable or not based on variations of the internal impedances calculated in said step of calculating a plurality of internal impedances;

generating an internal impedance to be output based on the internal impedances only if it is judged in said step of judging that said internal impedances are reliable;

detecting the temperature of said secondary battery;

detecting the SOC of said secondary battery;

correcting the internal impedance to be output, based on the temperature detected in said step of detecting the temperature and the SOC detected in said step of detecting the SOC; and detecting a degradation degree of said secondary battery based on the internal impedance to be output which has been corrected in said step of correcting an internal impedance to be output.

* * * * *